(12) United States Patent
Kim et al.

(10) Patent No.: US 8,139,413 B2
(45) Date of Patent: Mar. 20, 2012

(54) FLASH MEMORY DEVICE

(75) Inventors: Hong-Soo Kim, Gyeonggi-do (KR);
Hwa-Kyung Shin, Gyeonggi-do (KR);
Min-Chul Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 561 days.

(21) Appl. No.: 12/367,889

(22) Filed: Feb. 9, 2009

(65) Prior Publication Data

US 2009/0201733 A1 Aug. 13, 2009

(30) Foreign Application Priority Data

Feb. 11, 2008 (KR) .................. 10-2008-0012298

(51) Int. Cl.
*G11C 16/04* (2006.01)

(52) U.S. Cl. ......... 365/185.11; 365/185.17; 365/185.23; 365/230.03

(58) Field of Classification Search ............. 365/185.11, 365/230.03, 185.23, 185.17
See application file for complete search history.

(56) References Cited

U.S. PATENT DOCUMENTS

| | | | | |
|---|---|---|---|---|
| 5,278,785 A | * | 1/1994 | Hazani | 365/185.16 |
| 5,687,117 A | * | 11/1997 | Chevallier et al. | 365/185.12 |
| 6,418,074 B1 | * | 7/2002 | Ogane | 365/204 |
| 6,913,969 B2 | | 7/2005 | Yoo | |
| 7,149,112 B2 | * | 12/2006 | Kim | 365/185.05 |
| 7,259,990 B2 | * | 8/2007 | Maejima et al. | 365/185.17 |
| 7,551,490 B2 | * | 6/2009 | Kim | 365/185.25 |
| 2006/0202263 A1 | | 9/2006 | Lee | |
| 2007/0212880 A1 | | 9/2007 | Park et al. | |

FOREIGN PATENT DOCUMENTS

| | | |
|---|---|---|
| JP | 2003-124362 | 4/2003 |
| JP | 2004-048004 | 2/2004 |
| KR | 1020030094683 A | 12/2003 |
| KR | 1020040005331 A | 1/2004 |
| KR | 1020050097595 A | 10/2005 |
| KR | 1020050108775 A | 11/2005 |
| KR | 1020060099690 A | 9/2006 |
| KR | 100706815 B1 | 4/2007 |

* cited by examiner

*Primary Examiner* — Pho M Luu
(74) *Attorney, Agent, or Firm* — Myers Bigel Sibley & Sajovec, P.A.

(57) ABSTRACT

A flash memory device can include a memory cell array that includes a plurality of memory blocks, where each of the memory blocks has memory cells arranged at intersections of word lines and bit lines, where ones of the plurality of memory blocks are immediately adjacent to one another and define memory block pairs. The flash memory device can further include a row selection circuit that is configured to drive the word lines responsive to memory operations associated with a memory address, where the row selection circuit can include respective shield lines that are located between the memory blocks included in each pair and each of the memory blocks in the pair has a common source line therebetween.

18 Claims, 7 Drawing Sheets

FLASH MEMORY DEVICE

CROSS-REFERENCE TO RELATED APPLICATIONS

This U.S. non-provisional patent application claims priority under 35 U.S.C. §119 of Korean Patent Application No. 10-2008-0012298, filed on Feb. 11, 2008, the entire contents of which are hereby incorporated by reference.

BACKGROUND

The present invention disclosed herein relates to a flash memory device.

Flash memory can be divided into a NOR type and a NAND type according to the connection state between a cell and a bit line. In general, NOR flash memory may be less suited to high levels of integration, but may be suitable for some high speed applications. NAND flash memory may consume less cell current than NOR flash memory, and therefore, may be more advantageous in situations where high levels of integration are desired.

NAND flash memory may be capable of performing basic functions such as read, write (or, program), or erase operation. Cells in NAND flash memory may be erased and programmed using Fowler-Nordheim tunneling current.

SUMMARY

Embodiments of the present invention can provide flash memory devices that can include a memory cell array that includes a plurality of memory blocks, where each of the memory blocks has memory cells arranged at intersections of word lines and bit lines, where ones of the plurality of memory blocks are immediately adjacent to one another and define memory block pairs. The flash memory device can further include a row selection circuit that is configured to drive the word lines responsive to memory operations associated with a memory address, where the row selection circuit can include respective shield lines that are located between the memory blocks included in each pair and each of the memory blocks in the pair has a common source line therebetween.

In some embodiments, the row selection circuit includes: a decoder driving the word lines through corresponding voltages; and switching units connected to corresponding memory blocks, the switching units switching to apply the voltages to corresponding word lines, wherein each of the shield lines is disposed between the switching units corresponding to the memory block pair.

In other embodiments, the shield lines are connected to a ground voltage.

In still other embodiments, word lines of the memory block pairs extend to corresponding switching units, respectively; and the word lines of memory block extending to the switching units are disposed facing each other by respectively corresponding pairs, with the shield line therebetween.

In even other embodiments, the decoder drives word lines of a selected memory block through the corresponding voltages.

In yet other embodiments, the shield line extends between the decoders corresponding to the switching units, the switching units corresponding to the memory block pair.

In further embodiments, each word line of non-selected memory blocks is in a floating state.

In still further embodiments, the shield lines are formed of a conductive material.

In even further embodiments, the shield lines are formed of the same material as the word lines.

In yet further embodiments, the shield lines are formed of the same material as gates of the memory cells.

In yet further embodiments, the shield lines are formed of the same material as the common source line.

In yet further embodiments, the shield lines are disposed on a device isolation layer on a semiconductor substrate having the switching units; word lines of the memory blocks pairs extend to the device isolation layer of the respective corresponding switching units; and the word lines of the extended memory block pairs face each other by the respectively corresponding pairs, with the shield line therebetween.

In yet further embodiments, the shield lines are disposed on the same layer as the word lines during a manufacturing process.

In yet further embodiments, the shield lines and the word lines are simultaneously formed during a manufacturing process.

In yet further embodiments, the shield lines are formed on the same layer as the common source lines during a manufacturing process.

In yet further embodiments, the shield lines and the common source lines are simultaneously formed during a manufacturing process.

In other embodiments of the present invention, memory systems include: the flash memory device; and a memory controller controlling the flash memory device.

In still other embodiments of the present invention, computing systems include: a micro processor: the flash memory device; and a memory controller controlling the flash memory device in response to a request of the micro processor.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

It will be understood that the term "immediately adjacent" includes arrangements where two elements (such as switching units) are located so that no other of those elements is located between two of the elements that are described as being immediately adjacent to one another.

Figure 1:
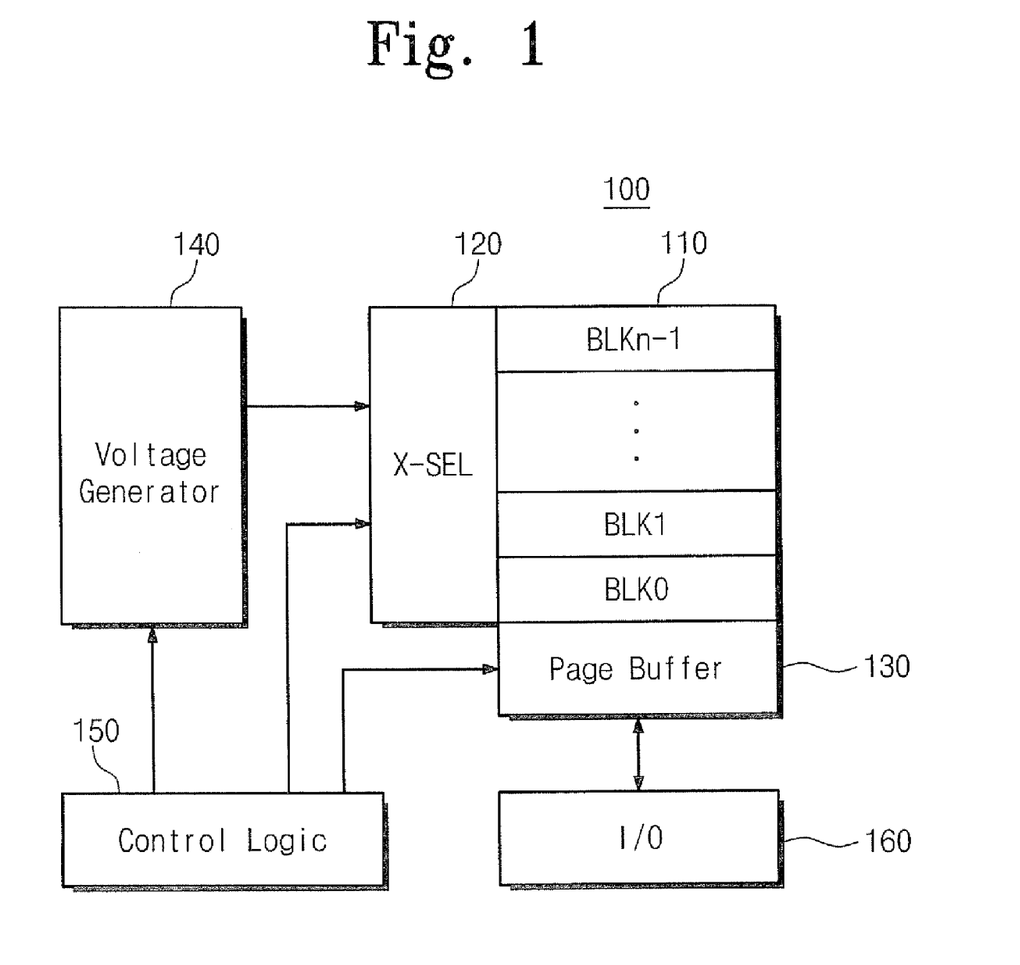
FIG. 1 is a block diagram of a flash memory device according to an embodiment of the present invention.
Figure 2:
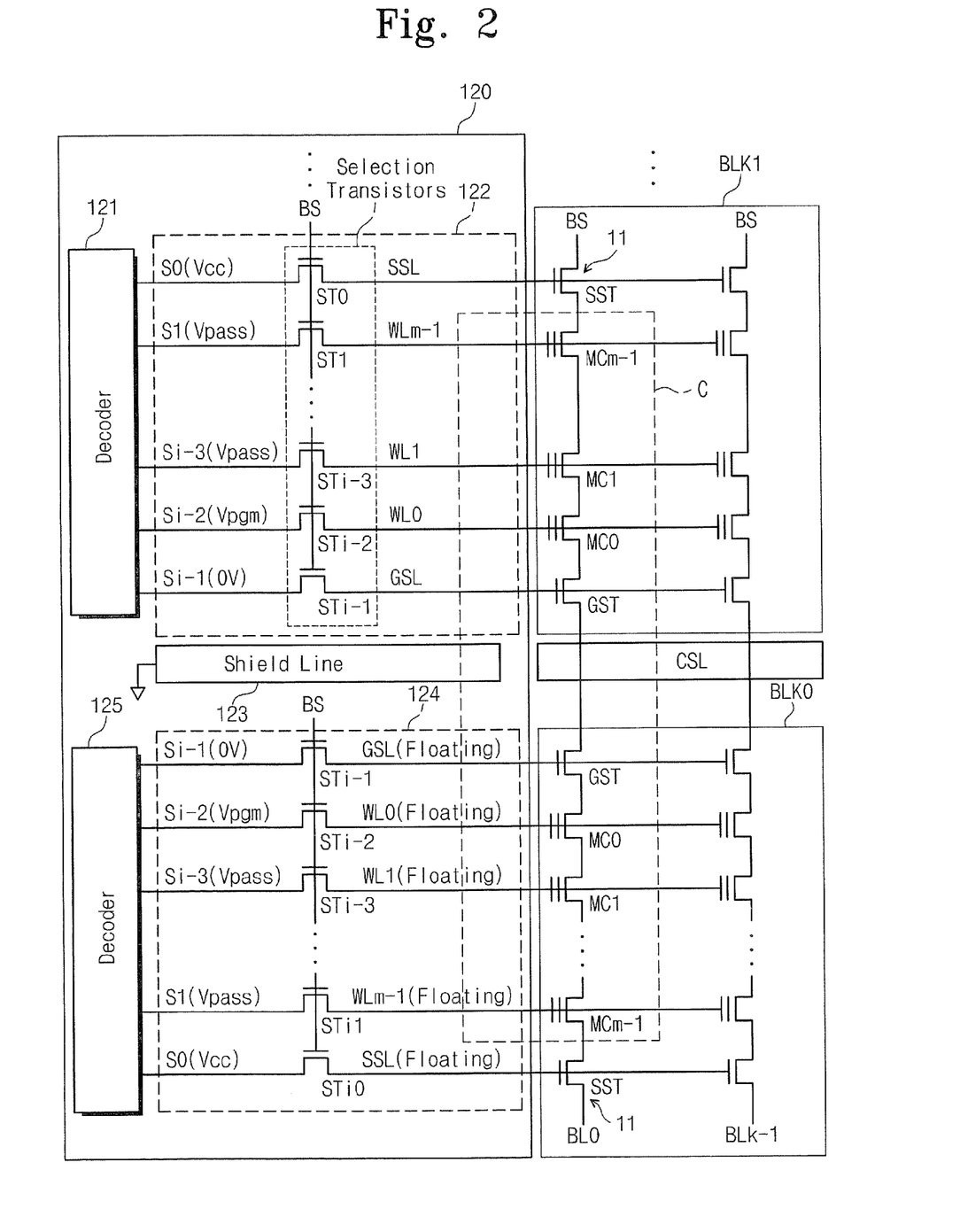
FIG. 2 is a plan illustrating a structure of a memory cell array and a row selection circuit of FIG. 1.

FIG. 1 is a block diagram of a flash memory device according to an embodiment of the present invention. FIG. 2 is a view illustrating a structure of a cell array and a row selection circuit of FIG. 1.

Referring to FIGS. 1 and 2, a flash memory device 100 includes a memory cell array 110, a row selection circuit (or, X-SEL) 120, a page buffer 130, a voltage generator 140, a control logic 150, and an input/output (or, I/O) device 160.

The memory cell array 110 includes a plurality of memory blocks BLK0 to BLKn−1. In FIG. 2, only arbitrary two memory blocks BLK0 and BLK1 constituting one pair and having a common source line CSL therebetween are illustrated. The memory block BLK0 illustrates a non-selected memory block and the memory block BLK1 illustrated a selected memory block. Additionally, FIG. 2 illustrates a case when a word line WL0 of the selected memory block BLK1 is selected. Among the memory blocks BLK0 to BLKn−1, as illustrated in FIG. 2, the memory blocks BLK0 and BLK1 having the common source line CSL constitute one pair.

Each of the memory blocks BLK0 to BLKn−1 of the memory cell array 110, as illustrated in FIG. 2, includes a plurality of cell strings (or, NAND strings) 11 connected to the bit lines BL0 to BLk−1, respectively. The bit lines BL0 to BLk−1 are arranged to be shared by the memory blocks BLK0 to BLKn−1. The cell string 11 of each column includes a string selection transistor SST, a ground selection transistor GST, and a plurality of memory cells (or, memory cell transistors) MC0 to MCm−1 connected in series between the selection transistors SST and GST. The strings 11 are electrically connected to the corresponding bit lines BL0 to BLk−1, respectively. In each string 11, the string selection transistor SST is connected to the string selection line SSL. The ground selection transistor GST is connected to the ground selection line GSL. The memory cells MC0 to MCm−1 are connected to the corresponding word lines WL0 to WLm−1, respectively. Cells of the strings 11 include floating gate transistors. Control gates of transistors are connected to the corresponding word lines WL0 to WLm−1, respectively. Sources of the memory cells connected to the ground selection line GSL are connected to the common source line CSL.

The row selection circuit 120 selects an arbitrary memory block in response to a row address (not shown) provided from the external, and selects an arbitrary word line of the selected memory block. Additionally, the row selection circuit 120 supplies word line voltages to respective word lines according to a control of the control logic 150.

The row selection circuit 120 includes decoders 121 and 125, switching units 122 and 124, and a shield line 123. The switching units 122 and 124 correspond to the decoders 121 and 125 and the memory blocks BLK0 to BLKn−1. FIG. 2 illustrates only the switching units 122 and 124 that correspond to one pair of memory blocks BLK0 and BLK1. As illustrated in FIG. 2, the shield line 123 is disposed between the switching units 122 and 124 corresponding to one pair of the memory blocks BLK0 and BLK1 having the common source line CSL therebetween and may extend to the decoders 121 and 125 corresponding to the switching units 122 and 124. Additionally, the shield line 123 is disposed between word lines corresponding to one memory block pair and extending to the corresponding switching units 122 and 124. The word lines WL0 to WLm−1 extending to the switching units 122 and 124 receive corresponding voltages through each word line contact. The shield line 123 is connected to a ground voltage GND. Specific arrangement structures of the memory cell array 110, the switching units, and the shield line 123 will be described in more detail with reference to FIGS. 3 through 6. The switching units 122 and 124 include selection transistors (or, switching transistors) ST0 to STi−1.

The string selection line SSL, the word lines WL0 to WLm−1, and the ground selection line GSL of each of the memory blocks BLK0 to BLKn−1 are connected to corresponding selection lines S0 to Si−1 through the selection transistors ST0 to STi−1.

The decoders 121 and 125 deliver corresponding voltages to the selection lines S0 to Si−1 in response to row address information (not shown). That is, the decoders 121 and 125 operate as a word line driver circuit. For example, the decoders 121 and 125 supply a program voltage to a selected word line of a selected memory block, and supply a pass voltage to non-selected word lines during a program operation mode. The decoders 121 and 125 supply a ground voltage to a selected word line and supply corresponding read voltages Vread to non-selected word lines during a read operation mode. The program voltage, the pass voltage, and read voltage are higher than the supply voltage.

Gates of the selection transistors ST0 to STi−1 are controlled by a block select signal BS. The selection transistors ST0 to STi−1 corresponding to a string selection line SSL, word lines WL0 to WLm−1, and a ground selection line GSL of a memory block, which will be selected, are respectively turned on by the block select signal BS. The selection transistors ST0 to STi−1 corresponding to a string selection line SSL, word lines WL0 to WLm−1, and a ground selection line GSL of a memory block, which will not be selected, are respectively turned off by the block select signal BS. Accordingly, the word lines WLm to WL0 of the non-selected memory blocks become a floating state.

The bit lines BL0 to BLk−1 arranged in the memory cell array 110 are electrically connected to the page buffer 130. The page buffer 130 detects data from the memory cells MC0 to MCm−1 of a word line selected through the bit lines BL0 to BLk−1 during a read/verify operation mode. Data to be programmed in the memory cells MC0 to MCm−1 during a program operation mode is loaded in the page buffer 130. The page buffer 130 supplies a supply voltage (or, a program-inhibited voltage) or a ground voltage (or, a program voltage) to the bit lines BL0 to BLk−1 according the loaded data to be programmed. The data loaded in the page buffer 130 are programmed into the memory cells MC0 to MCm−1 of a word line selected through to the above operations. The page buffer 130 includes page buffers sharing one pair of bit lines. However, the page buffer 130 may include page buffers corresponding to the bit lines BL0 to BLk−1, respectively.

The voltage generator 140 generates a plurality of voltages (e.g., Vpgm, Vpass, and Vread) necessary for each operation mode. The generated voltages are applied to corresponding word lines through the row selection circuit 120.

The control logic 150 controls general operations of the flash memory device 100.

The input/output device 160 provides data inputted from the external to the page buffer 150 during a program operation, and outputs the detected data to the external through the page buffer 150 during a read operation.

Referring to the above operations, the word lines WL0 to WLm−1 of the non-selected memory block BLK0 illustrated in FIG. 2 are in a floating state during a program operation. If there is no shield line 123, the word lines WL0 to WLm−1 of the memory block BLK0 extending to the corresponding switching units 122 and 124 and the word lines WL0 to WLm−1 of the memory block BLK1 are adjacent by respectively corresponding pairs. Accordingly, because of voltages Vpgm and Vpass applied to the word lines WL0 to WLm−1 of the selected memory block BLK1, the word lines WL0 to WLm−1 of the non-selected memory block BLK0 is affected by a coupling phenomenal. Due to the coupling phenomenon, a voltage level of the word lines WL0 to WLm−1 of the non-selected memory block BLK0 is increased.

However, the flash memory device 100 includes the shield line 123 disposed between word lines WL0 to WLm−1 of the memory block BLK0 and word lines WL0 to WLm−1 of the memory block BLK1, which extend to the corresponding switching units 122 and 124. The shield line 123 extends between the decoders 121 and 125 and receives a ground voltage. Accordingly, even if corresponding voltages Vpgm and Vpass are applied to the word lines WL0 to WLm−1 of the selected memory block BLK1, the word lines WL0 to WLn−1 of the non-selected memory block BLK0 in a floating state will not be affected by a coupling influence.

As a result, during a program operation, the flash memory device 100 prevents soft program of memory cells in a non-selected memory block.

Figure 3:
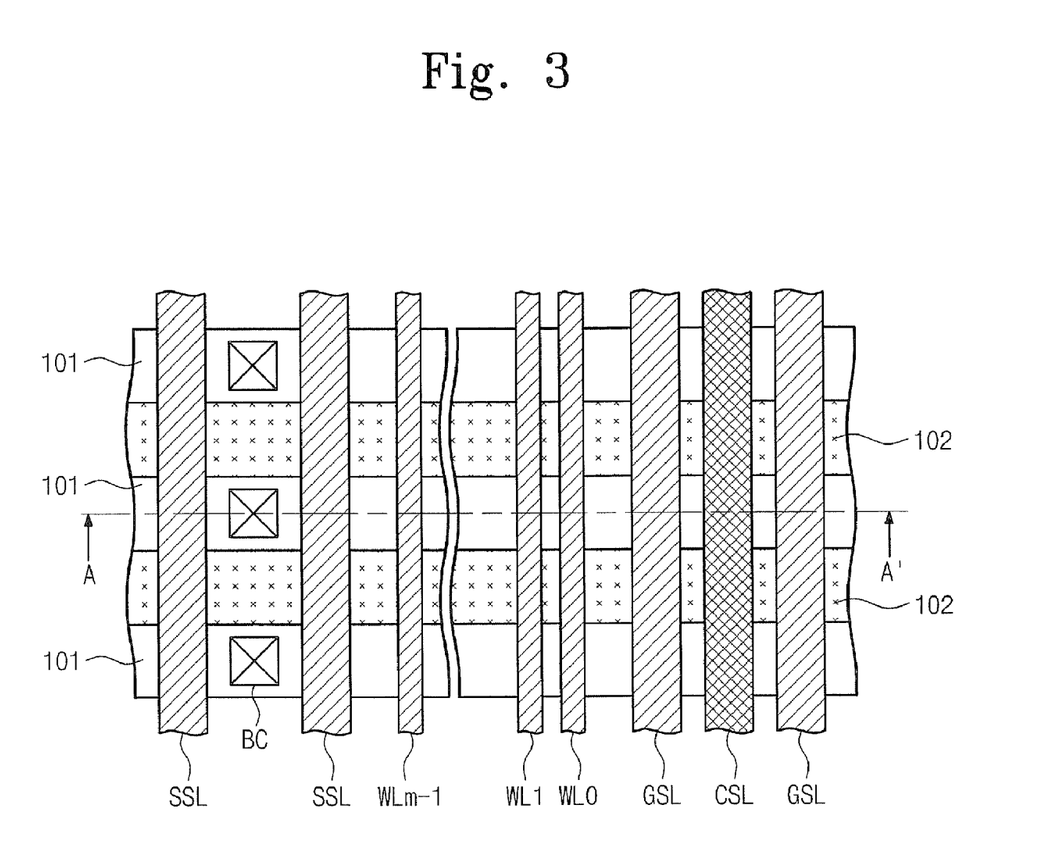
FIG. 3 is a plan view illustrating a memory cell array of FIG. 2.
Figure 4:
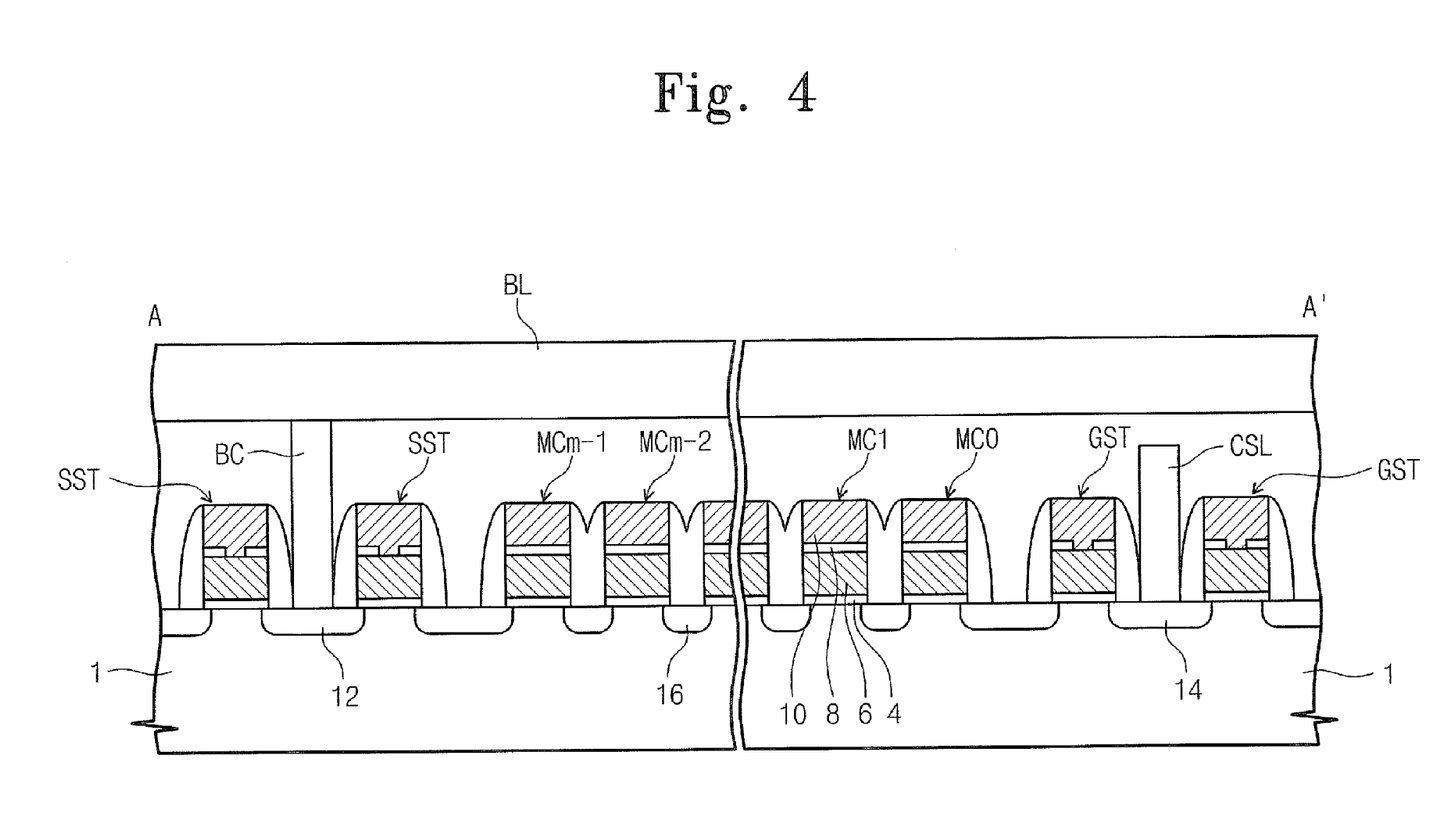
FIG. 4 is a cross-sectional view taken along a line A-A' in FIG. 3.

FIG. 3 is a plan view illustrating the memory cell array of FIG. 2. FIG. 4 is a cross-sectional view taken along a line A-A' of FIG. 3.

First, referring to FIG. 3, active regions 101 of a semiconductor substrate are disposed in parallel by a device isolation layer 102. The semiconductor substrate may be a silicon substrate. A plurality of transistors SST, GST, and MC0 to MCm−1 are formed on the active region 101. Between one pair of adjacent ground selection transistors GST and one pair of adjacent string selection transistors SST, a plurality of memory cell transistors MC0 to MCm−1 are formed. The plurality of memory cell transistors MC0 to MCm−1 constitute a string. The string selection line SSL connected to the string selection transistor SST extends in a direction intersecting the active region 101. The word lines WL0 to WLm−1 connected to the memory cell transistors MC0 to MCm−1 extend in a direction intersecting the active region 101. A bit line BL is connected to an active region between one pair of adjacent string selection transistors SST through a bit line contact BC, and bit line BL extend on the active region 101. A common source line CSL is formed on the active region 101 between one pair of adjacent ground selection transistors GST. The common source line CSL extend in a direction intersecting the active region 101.

Referring to FIG. 4, a plurality of memory cell transistors MC0 to MCm−1, a string selection transistor SST, and a ground selection transistor GST are formed on an active region of the semiconductor substrate 1. The memory cell transistors MC0 to MCm−1 are connected in series between the string selection transistor SST and the ground selection transistor GST in order to form a string. A drain 12 of the string selection transistor SST is connected to the bit line BL through the bit line contact BC. A source 14 of the ground selection transistor GST is connected to the common source line CSL. Each of the memory cell transistors MC0 to MCm−1 has a gate structure where a tunnel oxide layer 4, a charge storage layer 6, a gate interlayer dielectric layer, and a control gate electrode 10 are sequentially stacked on the semiconductor substrate 1. The charge storage layer 6 may be a floating gate or a charge trap layer. Additionally, each of the memory cell transistors MC1 to MCm−1 has a self-aligned source/drain 16 in a gate structure. The control gate electrode 10 of each of the memory cell transistors MC0 to MCm−1 may be also called as a control gate and the charge storage layer 6 may be also called as a floating gate. The common source line CSL is formed of a conductive metal such as tungsten. Gates of the memory cell transistors MC0 to MCm−1 extend in a direction intersecting the active region 101 and are connected to each other, such that the word line WL0 to WLm−1 are formed.

Figure 5:
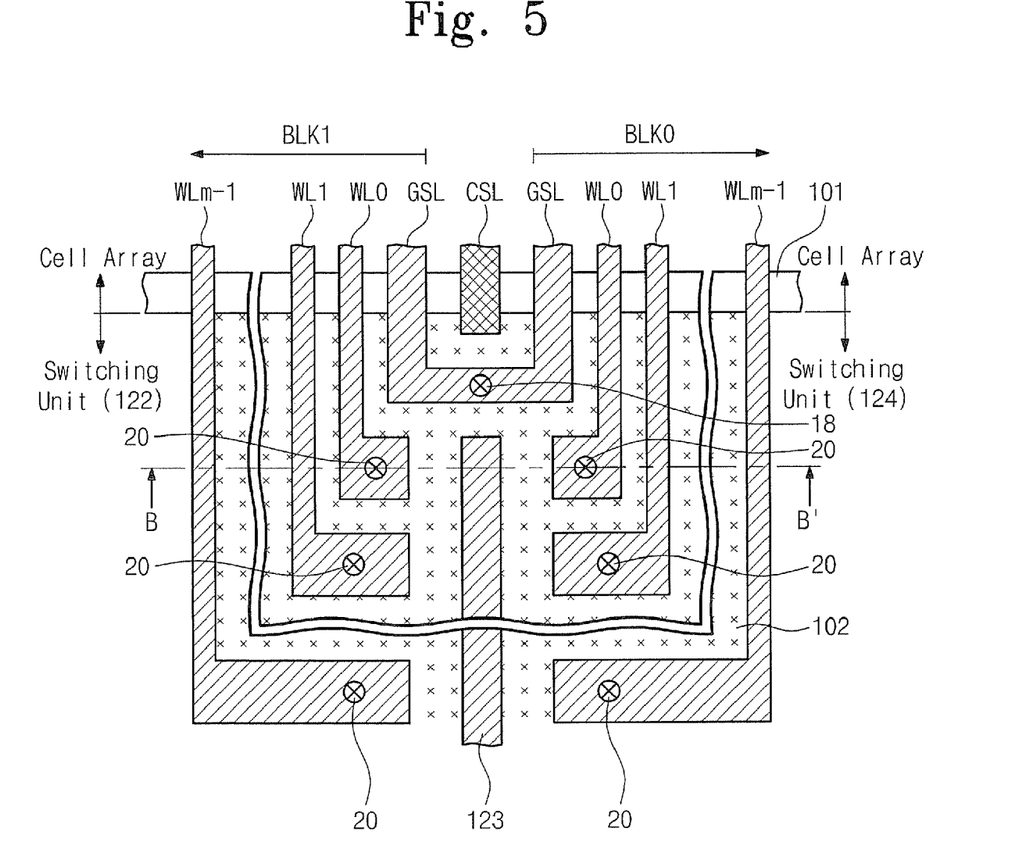
FIG. 5 is a plan view illustrating a region C of FIG. 2.
Figure 6:
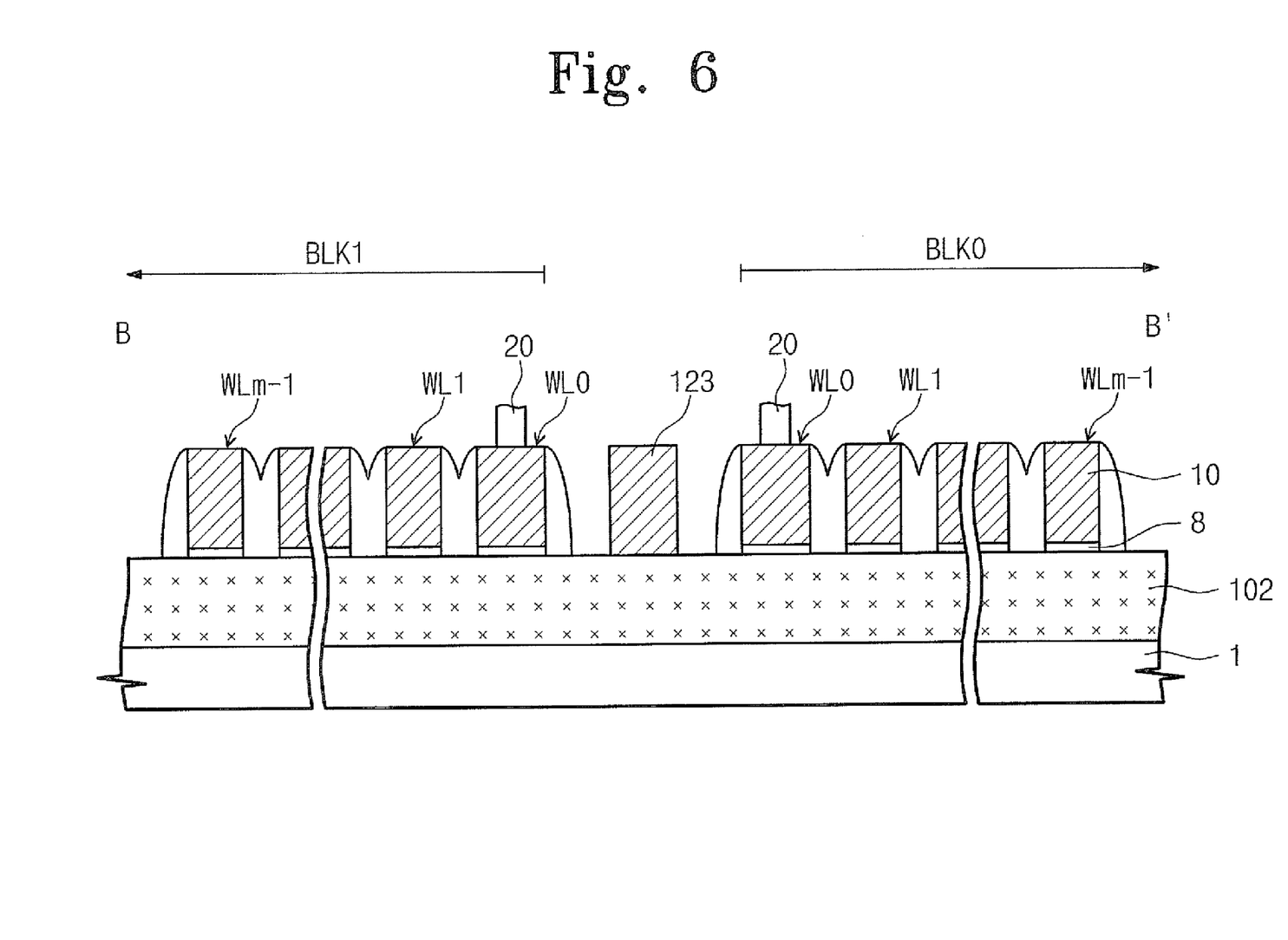
FIG. 6 is a cross-sectional view taken along a line B-B' of FIG. 5.

FIG. 5 is a plan view illustrating a region C of FIG. 2. FIG. 6 is a cross-sectional view taken along a line B-B' of FIG. 5.

As mentioned above, referring to FIG. 5, a memory block BLK1 is a selected memory block, a memory block BLK0 is a non-selected memory block, and a word line WL0 of the selected memory block BLK1 is a selected word line.

First, referring to FIG. 5, the switching units 122 and 124 connected to the memory blocks BLK0 and BLK1 of a cell array are disposed on a device isolation layer 102 of a semiconductor substrate. The ground selection line GSL of each of the memory blocks BLK0 and BLK1 extends to the switching units 122 and 124, and is disposed to be shared between the switching unit 122 and 124. The ground selection line GSL of the memory blocks BLK0 and BLK1 shared between the switching units 122 and 124 receives a ground voltage through a contact 18 during a program operation.

The word lines WL0 to WLm−1 of the memory blocks BLK0 and BLK1 extend to the corresponding switching units 122 and 124. The shield line 123 is disposed between the word lines WL0 to WLm−1 of a selected memory block BLK1 and the word lines WL0 to WLm−1 of a non-selected memory block BLK0, which extend to the corresponding switching units 122 and 124. The word lines WL0 to WLm−1 of the memory blocks BLK0 and BLK1 extending to the switching units 122 and 124 are disposed to face each other by respectively corresponding pairs and include the shield line 123 therebetween.

The shield line 123 may extend between the decoders 121 and 125 as illustrated in FIG. 2. The shield line 123 is formed of a conductive material and also is formed of the same material as the word lines WL0 to WLm−1. Since the shield line 123 is formed of the same material (i.e., a common material) as the word lines WL0 to WLm−1, it will be simultaneously formed on the same layer (see FIG. 6) together with the word line WL0 to WLm−1. As mentioned above, gates of the memory cell transistors MC0 to MCm−1 extend in a direction intersecting the active region 101 and are connected to each other such that the word lines WL0 to WLm−1 are formed. Accordingly, the shield line 123 is formed of the same material (i.e., a common material) as the gates of the memory cell transistors MC0 to MCm−1. The word lines WL0 to WLm−1 extending to the corresponding switching units 122 and 124 receive a corresponding voltage through corresponding contacts 20.

The shield line 123 may be formed of the same material (i.e., a common material) as the word line and the common source line CSL. If the shield line 123 is formed of the same material as the common source line CSL, it will be simultaneously formed on the same layer together with the common source line CSL.

Referring to FIG. 6, a plurality of word lines WL0 to WLm−1 and the shield line 123 are formed on the same layer on the device isolation layer 102 of a semiconductor substrate 1. Additionally, referring to FIG. 2, the plurality of word lines WL0 to WLm−1 and the common source line are formed on the same layer. Accordingly, the shield line 123 is formed on the same layer as the common source line CSL.

The word line WL0 of the memory block BLK0 and the word line WL0 of the memory block BLK1 receive a corresponding voltage through a corresponding contact 20. Although not illustrated in FIG. 6, other word lines WL1 to WLm−1 of the memory blocks BLK0 and BLK1 receive a corresponding voltage through the corresponding contact 20.

Referring to the above-mentioned operations, during a program operation, the word line WL0 of the selected memory block BLK1 receives a program voltage Vpgm and the word lines WL1 to WLm−1 of the selected memory block BLK1 receive a pass voltage Vpass. The word lines WL0 to WLm−1 of a non-selected memory block BLK0 is in a floating state.

If there is no shield line 123, the word lines WL0 to WLm−1 of the memory block BLK0 and the word lines WL0 to WLm−1 of the memory block BLK0, which extend to the corresponding switching unit 122 and 124, are adjacent by respectively corresponding pairs. As a memory device is highly integrated, the respectively corresponding word line pairs extending to the switching units 122 and 124 become closer. Accordingly, by the voltages Vpgm and Vpass applied to the word lines WL0 to WLm−1 of the selected memory block BLK1 and the non-selected memory block BLK0 extending to the switching unit 124 are affected by a coupling phenomenon. Due to the coupling influence, a voltage level of the word lines WL0 to WLm−1 of the non-selected memory block BLK0 will be increased. In this case, the memory cells of the non-selected memory bock BLK0 may be soft programmed. The word line WL0 of the selected memory block BLK1 receives a program voltage Vpgm. The program voltage Vpgm is higher than the pass voltage Vpass. Accordingly, the word line WL0 of the non-selected memory block BLK0 adjacent to the word line WL0 of the selected memory block BLK1 receives higher coupling influence than other word lines WL1 to WLm−1. Accordingly, due to a coupling influence, a voltage level of the word line WL0 of the non-selected memory block BLK0 is raised to the highest among the word lines WL0 to WLm−1 of the non-selected memory block BLK0. In this case, the memory cells connected to the word line WL0 of the non-selected memory block may have the highest possibility to be soft programmed.

However, the flash memory device 100 includes a shield line 123 between word lines WL0 to WLm−1 of the memory block BLK0 and word lines WL0 to WLm−1 of the memory block BLK1, which extend to the corresponding switching units 122 and 124. The shield line 123 receives a ground voltage. Even if voltages Vpgm and Vpass are applied to the word lines WL0 to WLn−1 of the selected memory block BLK1, a voltage level of the shield line 123 receiving a ground voltage is not raised by coupling. Additionally, a voltage level of the word lines WL0 to WLn−1 of the non-selected memory block BLK0 is not affected by a coupling influence because of the shield line 123 receiving a ground voltage.

As a result, during a program operation, the flash memory device of the present invention prevents soft program of memory cells in a non-selected memory block.

Figure 7:
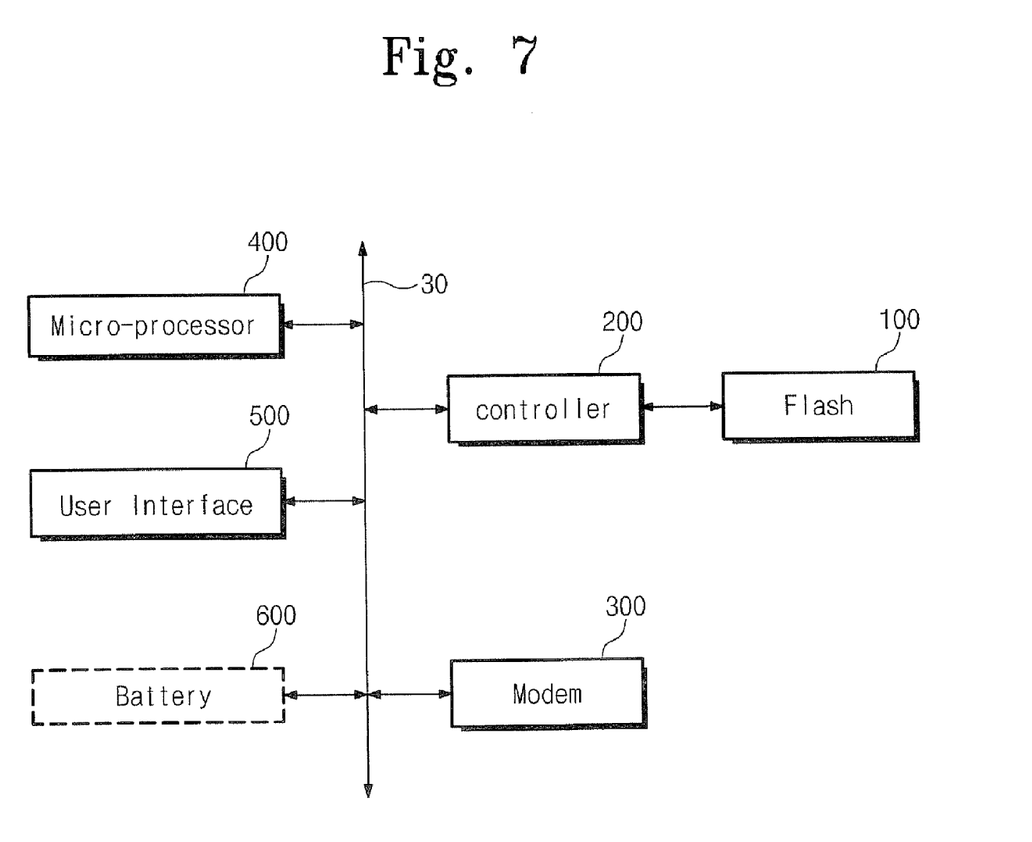
FIG. 7 is a view illustrating a computing system with a flash memory device according to the present invention.

FIG. 7 is a block diagram illustrating a computing system including a flash memory device according to the present invention.

The flash memory device is a non-volatile memory device retaining stored data even if there is no power. As usage of mobile devices such as a cellular phone, a personal digital assistant (PDA), a digital camera, a portable game console, and an MP3 player is increased, the flash memory device is used as a data storage and also widely used as a code storage. Furthermore, the flash memory device is also uses in home applications such as HDTV, DVD, a router, and GPS. As shown in FIG. 7, the computing system includes the flash memory device. The computing system includes a microprocessor 400, a user interface 500, a modem 300 such as a baseband chipset, a flash memory controller 200, and a flash memory device 100, which are connected through a bus 30. The flash memory controller 200 and the flash memory device 100 constitute a flash memory system. The flash memory device is configured with the same components as FIG. 1. N-bit data (N is an integer equal to or greater than 1) processed/to be processed by the microprocessor 400 is stored in the non-volatile memory 100 through the memory controller 200. If the computing system according to the present invention is a mobile device, a battery 600 is additionally provided to supply an operating voltage to the computing system. Although not illustrated in the drawings, it is apparent to those skilled in the art that an application chipset, a camera image processor (CIS), a mobile DRAM, etc. can be further provided in the computing system 2000 according to the present invention.

According to the present invention, a flash memory device is capable of preventing or reducing the likelihood of a soft program (i.e., un-intended program) of memory cells in a non-selected memory block.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
a memory cell array including a plurality of memory blocks, each of the memory blocks having memory cells arranged at intersections of word lines and bit lines, ones of the plurality of memory blocks immediately adjacent to one another comprising memory block pairs; and
a row selection circuit configured to drive the word lines responsive to memory operations associated with a memory address, wherein the row selection circuit includes respective shield lines located between the memory blocks included in each pair and each of the memory blocks in the pair having a common source line therebetween, wherein the row selection circuit comprises:
switching units connected to corresponding memory blocks, the switching units switching to apply corresponding voltages to corresponding word lines,
wherein each of the shield lines is between immediately adjacent switching units connected to word lines of the memory blocks in the pair.

2. The flash memory device of claim 1, wherein the row selection circuit comprises:
a decoder circuit configured to drive the word lines through the corresponding voltages.

3. The flash memory device of claim 1, wherein the shield lines are connected to a ground voltage.

4. The flash memory device of claim 1, wherein:
word lines of the memory block pairs extend to corresponding switching units, respectively; and
the word lines of memory block extending to the switching units are disposed facing each other by respectively corresponding pairs, wherein the shield line is located therebetween.

5. The flash memory device of claim 2, wherein the decoder circuit drives word lines of a selected memory block through the corresponding voltages.

6. The flash memory device of claim 1, wherein the shield line extends from between the immediately adjacent switching units to between immediately adjacent decoders corresponding to the switching units, the switching units corresponding to the memory block pair.

7. The flash memory device of claim 1, wherein the row selection circuit is configured to maintain each word line of non-selected memory blocks in a floating state.

8. The flash memory device of claim 1, wherein the shield lines comprise a conductive material.

9. The flash memory device of claim 1, wherein the shield lines and the word lines comprise a common material.

10. The flash memory device of claim 1, wherein the shield lines and gates of the memory cells comprise a common material.

11. The flash memory device of claim 1, wherein the shield lines and the common source line comprise a common material.

12. The flash memory device of claim 1, wherein:
the shield lines are disposed on a device isolation layer on a semiconductor substrate having the switching units;
word lines of the memory blocks pairs extend to the device isolation layer of the respective corresponding switching units; and
the word lines of the memory block pairs face each other by the respectively corresponding pairs, with the shield line therebetween.

13. The flash memory device of claim 1, wherein the shield lines are formed on the same layer as the word lines.

14. The flash memory device of claim 1, wherein the shield lines and the word lines are simultaneously formed.

15. The flash memory device of claim 1, wherein the shield lines are formed on the same layer as the common source lines.

16. The flash memory device of claim 1, wherein the shield lines and the common source lines are simultaneously formed.

17. A memory system comprising:
a flash memory device including a memory cell array including a plurality of memory blocks, each of the memory blocks having memory cells arranged at intersections of word lines and bit lines, ones of the plurality of memory blocks immediately adjacent to one another comprising memory block pairs;
a row selection circuit configured to drive the word lines responsive to memory operations associated with a memory address, wherein the row selection circuit includes respective shield lines located between the memory blocks included in each pair and each of the memory blocks in the pair having a common source line therebetween, wherein each of the shield lines is between immediately adjacent switching units connected to word lines of the memory blocks in the pair; and
a memory controller configured to control the flash memory device.

18. A computing system comprising:
a microprocessor circuit;
a flash memory device including a memory cell array including a plurality of memory blocks, each of the memory blocks having memory cells arranged at intersections of word lines and bit lines, ones of the plurality of memory blocks immediately adjacent to one another comprising memory block pairs;
a row selection circuit configured to drive the word lines responsive to memory operations associated with a memory address, wherein the row selection circuit includes respective shield lines located between the memory blocks included in each pair and each of the memory blocks in the pair having a common source line therebetween, wherein each of the shield lines is between immediately adjacent switching units connected to word lines of the memory blocks in the pair; and
a memory controller configured to control the flash memory device in response to a request of the microprocessor circuit.

* * * * *